United States Patent
Bailey et al.

(10) Patent No.: US 11,665,861 B2
(45) Date of Patent: May 30, 2023

(54) EDGE DATACENTER NANO ENCLOSURE WITH CHIMNEY AND RETURN AIR CONTAINMENT PLENUM

(71) Applicant: DELL PRODUCTS, L.P., Round Rock, TX (US)

(72) Inventors: Mark M. Bailey, Round Rock, TX (US); Trey S. Wiederhold, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 369 days.

(21) Appl. No.: 16/744,090

(22) Filed: Jan. 15, 2020

(65) Prior Publication Data

US 2021/0219461 A1 Jul. 15, 2021

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01); *H05K 7/20145* (2013.01); *H05K 7/20754* (2013.01); *H05K 7/20836* (2013.01)

(58) Field of Classification Search
CPC ............. H05K 7/20745; H05K 7/1497; H05K 7/20145; H05K 7/20754; H05K 7/20836; H05K 7/20736; H05K 7/206
USPC ........................................................ 454/181
See application file for complete search history.

(56) References Cited

U.S. PATENT DOCUMENTS

| 3,559,728 A * | 2/1971 | Lyman | H05K 7/206 165/122 |
|---|---|---|---|
| 9,606,588 B2 | 3/2017 | Dean et al. | |
| 2003/0085025 A1* | 5/2003 | Woods | H05K 7/206 165/104.33 |
| 2007/0144704 A1* | 6/2007 | Bundza | H05K 7/206 165/48.1 |
| 2008/0049396 A1* | 2/2008 | Campbell | H05K 7/20754 361/696 |
| 2008/0285228 A1* | 11/2008 | Koch | H05K 7/20781 361/679.53 |
| 2017/0064875 A1 | 3/2017 | Casey et al. | |
| 2017/0257970 A1* | 9/2017 | Alleman | G06F 1/20 |
| 2017/0280593 A1* | 9/2017 | Magallanes | H05K 7/20818 |
| 2017/0295675 A1* | 10/2017 | Huang | H05K 7/20754 |
| 2017/0325354 A1* | 11/2017 | Lee | H05K 7/20209 |

(Continued)

FOREIGN PATENT DOCUMENTS

WO WO-2015121994 A1 * 8/2015 ........... H05K 7/1454

*Primary Examiner* — Steven B McAllister
*Assistant Examiner* — Charles R Brawner
(74) *Attorney, Agent, or Firm* — Isidore PLLC

(57) ABSTRACT

A modular data center has an air handling unit (AHU) that is coupled to a first panel that is engaged over a first opening in a volumetric container. The AHU directs pressurized supply air through a supply air outlet into a cold aisle causing the supply air to pass through a first side of the IT component(s) installed in an interior of the volumetric container. A chimney of a return air plenum captures return air from a second side of the IT component(s), directing the return air to a return air duct of the return air plenum that is connected to a return air inlet of the AHU. In one or more embodiments, a second AHU is coupled to a second panel that is engaged to a second opening in a second side, directing pressurized supply air via a supply air plenum to the opposing first side.

20 Claims, 9 Drawing Sheets

(56) References Cited

U.S. PATENT DOCUMENTS

| | | | |
|---|---|---|---|
| 2018/0054923 A1* | 2/2018 | Bryan | G06F 1/206 |
| 2019/0011194 A1* | 1/2019 | Mulinti | F24F 5/0075 |
| 2019/0198834 A1* | 6/2019 | Maloney | H04Q 1/14 |
| 2019/0327861 A1 | 10/2019 | Duncan et al. | |
| 2019/0327862 A1 | 10/2019 | Bailey et al. | |

* cited by examiner

EDGE DATACENTER NANO ENCLOSURE WITH CHIMNEY AND RETURN AIR CONTAINMENT PLENUM

BACKGROUND

1. Technical Field

The present disclosure generally relates to a data center nano enclosure, and in particular to air cooling of rack mounted equipment within a nano enclosure.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs used at end user locations are often open racks containing information technology (IT) and telecommunication (telco) components. At end user locations, excess heat generated by the IHS is often exhausted out into the room by individual fans that move air through each individual chassis. The open rack can be locked in a small room for security and to mitigate the fan noise. By contrast, enterprise JHSs are in the form a data center with a large number of racks containing densely configured IHSs. To meet the significant cooling requirements efficiently, these enterprise rack information handling systems (RIHSs) are positioned between a cold aisle and a hot aisle. A positive pressure differential between the cold and the hot aisle results in air flow through the RIHSs for cooling heat-generating IT and telco components. The data centers have infrastructure subsystems that manage power conditioning, cooling, performance monitoring, and security to ensure high availability of the RIHS to meet workloads. Increasingly, needs arise to place compute and storage devices for workloads closer to the end user and not at a centralized data center. Generally-known approaches for edge-based solutions for RIHS do not provide comparable infrastructure support to enterprise IHSs.

BRIEF SUMMARY

Disclosed are a modular data center (MDC), an air cooling system for the MDC, and a method for installing the air handling system that moderates or cools a temperature of the MDC. According to one embodiment, an MDC includes a volumetric container having a first side with at least a first opening. The MDC is configured with (i) a cold aisle proximate to the first side; (ii) a hot aisle proximate to a second side that is opposed to the first side; and (iii) interior space extending between the cold aisle and hot aisle. The volumetric container includes a first panel that is engageable over the first opening and has at least one aperture. Heat-generating information technology (IT) component(s) are installed in the interior space of the volumetric container. Each of the IT component(s) has a first side and a second side, opposed to the first side. The first side of each heat-generating IT component is designed to face the cold aisle. The second side of each heat-generating IT component is designed to face the hot aisle. A first air handling unit (AHU) is coupled to the first panel. A supply air outlet and a return air inlet of the first AHU are respectively in fluid communication with the interior space of the volumetric container via the at least one aperture of the first panel. The supply air outlet directs pressurized supply air into the cold aisle causing the supply air to pass through the first side of the heat-generating IT component(s). A chimney of a return air plenum receives return air from the second side of the heat-generating IT component(s). A return air duct extends from the chimney at the hot aisle through the interior space of the volumetric container to the cold aisle and is connected to the return air inlet. The return air duct directs the return air collected at the chimney to the return air inlet of the first AHU.

According to a next embodiment, an air handling system for an MDC includes a volumetric container, a first air handling unit (AHU), and a return air plenum. The volumetric container has a first side with at least a first opening and is configured with (i) a cold aisle proximate to the first side and (ii) a hot aisle proximate to a second side that is opposed to the first side and (iii) interior space extending between the cold aisle and hot aisle. The volumetric container includes a first panel engageable over the first opening. The first panel has at least one aperture. The first AHU is coupled to the first panel. The first AHU has a supply air outlet and a return air inlet that are respectively in fluid communication with the interior space of the volumetric container via the at least one aperture of the first panel. The supply air outlet directs pressurized supply air into the cold aisle, causing the supply air to pass through heat-generating IT component(s) that may be installed in the interior space of the volumetric container. Each IT component has a first side and a second side, opposed to the first side. The first side of each heat-generating IT component is designed to face the cold aisle. The second side of each heat-generating IT component is designed to face the hot aisle. A chimney of a return air plenum receives return air from the second side of the heat-generating IT component(s). A return air duct of the return air plenum extends from the chimney at the hot aisle through the interior space of the volumetric container to the cold aisle and is connected to the return air inlet. The return air duct directs the return air collecting at the chimney from the chimney to the return air inlet of the first AHU.

According to another embodiment, a method is disclosed for installing an air handling system that moderates or cools a temperature of an MDC. In one or more embodiments, the method includes installing heat-generating IT component(s) in an interior space of a volumetric container. The volumetric container has a first side with at least a first opening. The volumetric container is configured with (i) a cold aisle proximate to the first side, (ii) a hot aisle proximate to a second side that is opposed to the first side, and (iii) the interior space extending between the cold aisle and hot aisle. Each IT component has a first side and a second side, opposed to the first side. The first side of each heat-generating IT component is designed to face the cold aisle. The second side of each heat-generating IT component is designed to face the hot aisle. The method includes attaching a chimney of a return air plenum to the second side of the heat-generating IT component(s) to receive return air. The method includes attaching a return air duct between the chimney and the return air inlet of the first AHU. The return air duct extends from the chimney at the hot aisle through the interior space of the volumetric container to the cold aisle and is connected to the return air inlet. The return air duct directs the return air from the chimney to the return air inlet of the first AHU. The method includes coupling a first AHU to a first panel with a supply air outlet and a return air inlet of the first AHU aligned with at least one aperture of the first panel. The method includes engaging the first panel over the first opening of the volumetric container to position the supply air outlet and the return air inlet respectively in fluid communication with the interior space of the volumetric container. The supply air outlet and the return air inlet are exposed to the interior space via the at least one aperture of the first panel. The supply air outlet directs pressurized supply air into the cold aisle causing the supply air to pass through the first side of the heat-generating IT component(s).

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
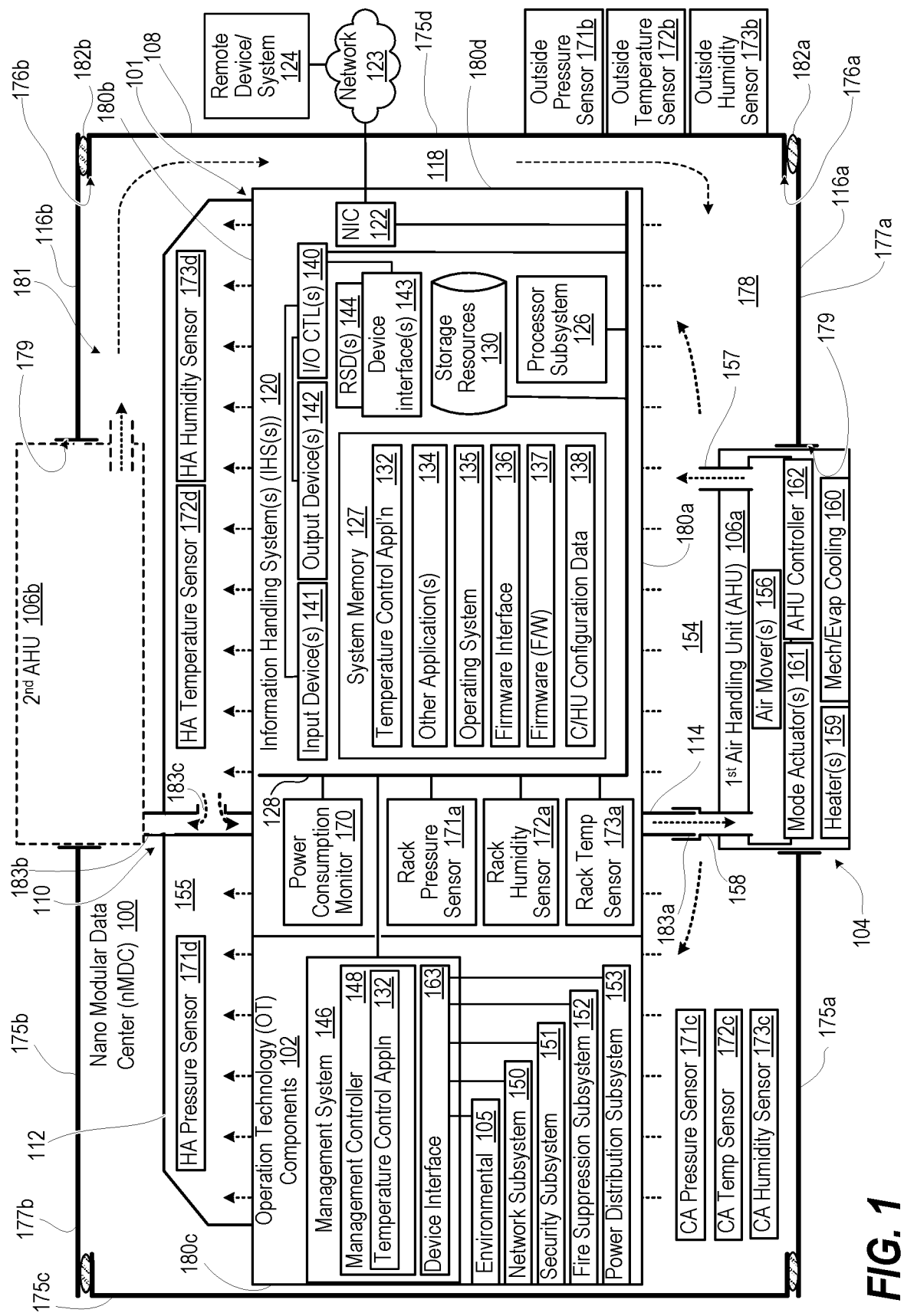
FIG. 1 depicts a functional block diagram of a nano modular data center (nMDC) having an air handling system that protects and supports information technology (IT) components and operation technology (OT) components, according to one or more embodiments.

The illustrative embodiments provide an information handling system that has an air handling unit (AHU) which is attached to a first panel engaged over a first opening in a first side of a volumetric container. The AHU directs pressurized supply air through a supply air outlet into a cold aisle causing the supply air to pass through a cold aisle facing side of the IT component(s) installed in an interior of the volumetric container. A chimney of a return air plenum captures return air from a hot aisle facing side of the IT component(s), directing the return air through a return air duct of the return air plenum, which is connected to a return air inlet of the AHU. In one or more embodiments, a second AHU is coupled to a second panel engaged to a second opening in a second side of the volumetric container, opposed to the first side. The second AHU directs pressurized supply air via a supply air plenum to the cold aisle at an opposite side of the volumetric container.

According to another aspect, modular data structure is provided having a volumetric container defined with a cold aisle and a hot aisle, and a portion of an interior space extending between the cold aisle and hot aisle. At least one information technology (IT) component is inserted into the interior space. The at least one IT component is oriented with a supply air side facing the cold aisle for receiving a flow of supply air. The at least one IT component is oriented with an opposed hot aisle side facing the hot aisle for returning/exhausting the supply air into the hot aisle. An AHU is attached to a first side panel enclosing the cold aisle. The AHU presents a supply air outlet and a return air inlet at the first side panel. The AHU directs pressurized supply air through a supply air outlet into the cold aisle causing the supply air to pass through the supply air side of the at least one IT component installed in the interior space of the volumetric container. A chimney is extended around the hot aisle, preventing the return air from circulating back into the interior space. A return air plenum is in fluid communication with and extends from the chimney back towards the cold aisle and connects to the return air inlet of the AHU. The chimney and return air plenum captures return air from the hot aisle and directs the return air, via a return air duct of the return air plenum, to the return air inlet of the AHU. In one or more embodiments, the first side panel is a removable access panel that serves as the access mechanism for accessing the IT components installed in the interior space. The first side panel provides an air-tight, mechanical seal with a front opening of the container at a corresponding front side of the container. In one or more embodiments, the volumetric container includes a supply air plenum is in fluid communication with the cold aisle and extends from the cold aisle across one side of the interior space back towards a supply air outlet of a second AHU that is coupled to a second side panel enclosing the hot aisle. The second AHU includes a return air inlet that is in fluid communication with the chimney to receive a portion of the return air. The second AHU directs pressurized supply air via an air duct of the supply air plenum to the cold aisle. In one or more embodiments, the second side panel is also removable and enables access to hot aisle side of the IT components installed in the interior space. The second side panel provides an air-tight, mechanical seal with a back opening of the volumetric container at a corresponding back side of the volumetric container.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a functional block diagram of a data center, and in particular a nano modular data center (nMDC) 100 that respectively includes information technology (IT) components 101 and operation technology (OT) components 102 that are protected and supported by air handling system 104. Active components of air handling systems 104 are part of environmental subsystem 105. In one or more embodiments, environmental subsystem 105 can monitor and control interior air conditions to ensure reliable operation of IT components 101 and OT components 102. In one or more embodiments, air handling system 104 includes one or two air handling units (AHUs) 106a-106b, volumetric container 108, return air plenum 110, which includes chimney 112, and return air duct 114. In one or more embodiments, air handling system 104 provides containment for efficient cooling and is attached/mounted to first panel 116a which supports access for maintenance and support. First AHU 106a is mounted on first panel 116a, which provides front access (i.e., at cold aisle 154) to IT components 101 and OT components 102. In one or more embodiments, air handling system 104 also includes supply air directing plenum 118 and second AHU 106b, which is mounted on second panel 116b that provides rear access (i.e., at hot aisle 155) to IT components 101 and OT components 102.

IT components 101 include information handling systems (IHSs) 120. Within the general context of IHSs, IHS 120 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, IHS 120 may be a server, blade server, rack-mounted server, rack-mounted data storage, or other rack-mounted IT equipment. IHS 120 may include random access memory (RAM), one or more processing resources such as a central processing unit (CPU) or hardware or software control logic, read only memory (ROM), and/or other types of nonvolatile memory. Additional components of the IHS 120 may include one or more disk drives, one or more network ports for communicating with external devices as well as various input and output (I/O) devices, such as a keyboard, a mouse, and a video display. The IHS 120 may also include one or more buses operable to transmit communications between the various hardware components. In one or more embodiments, IHS 120 is rack-mounted to provide computing, communication and storage functionality in nMDC 100.

IHS 120 includes a network interface, depicted as network interface controller (NIC) 122. NIC 122 is communicatively connected to network 123. Remote device systems 124 are also communicatively connected to network 123. NIC 122 enables IHS 120 and/or components within IHS 120 to communicate and/or interface with other devices, services, and components that are located external to IHS 120. IHS 120 receives IHS updates and work requests from remote device systems 124 via network 123. These devices, services, and components can interface with IHS 120 via an external network, such as network 123, using one or more communication protocols that include transport control protocol (TCP/IP) and network block device (NBD) protocol. Network 123 can be a local area network, wide area network, personal area network, and the like, and the connection to and/or between network 123 and IHS 120 can be wired, wireless, or a combination thereof. For ease of description, network 123 is indicated as a single collective component for simplicity. However, it should be appreciated that network 123 can comprise one or more direct connections to other devices as well as a more complex set of interconnections as can exist within a local area network or a wide area network, such as the Internet.

A processor subsystem 126 is coupled to system memory 127 via system interconnect 128. System interconnect 128 can be interchangeably referred to as a system bus, in one or more embodiments. System interconnect 128 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus. For the purpose of this disclosure, system interconnect 128 can also be a Double Data Rate (DDR) memory interface. The system memory 127 can either be contained on separate, removable dual inline memory module (RDIMM) devices or system memory 127 can be contained within persistent memory devices (NVDIMMs). For example, the NVDIMM-N variety of NVDIMMs contain both random access memory, which can serve as system memory 127, and non-volatile memory. It should be noted that other channels of communication can be contained within system interconnect 128, including but not limited to inter-integrated circuit (i2c) or system management bus (SMBus). System interconnect 128 communicatively couples various system components. Examples of system components include replaceable local storage resources 130 (illustrated as "Storage Resources") such as solid state drives (SDDs) and hard disk drives (HDDs). Software and/or firmware modules and one or more sets of data that can be stored on local storage resources 130 and be utilized during operations of IHS 120. Specifically, in one embodiment, system memory 127 can include therein a plurality of such modules, including temperature control application 132, other application(s) 134, operating system (OS) 135, a firmware (F/W) interface 136 such as basic input/output system (BIOS) or Uniform Extensible Firmware Interface (UEFI), and platform firmware 137. These software and/or firmware modules have varying functionality when their corresponding program code is executed by processor subsystem 126 or secondary processing devices within IHS 120. For example, other application(s) 134 may include a word processing application and a presentation application, among other applications. System memory 127 can include computer data structures and data values, such as cooling/heating configuration data 138 that specifies environmental ranges and limits for IT components 101 and OT components 102. These data structures and values can be used by applications (132, 134).

IHS 120 further includes one or more input/output (I/O) controllers 140 that support connection by and processing of signals from one or more connected input device/s 141, such as a keyboard, mouse, touch screen, or microphone. I/O controllers 140 also support connection to and forwarding of output signals to one or more connected output devices 142, such as a monitor or display device or audio speaker(s). Additionally, in one or more embodiments, one or more device interfaces 143, such as an optical reader, a universal serial bus (USB), a card reader, Personal Computer Memory Card International Association (PCMCIA) slot, and/or a high-definition multimedia interface (HDMI), can be associated with IHS 120. Device interface(s) 143 can be utilized to enable data to be read from or stored to corresponding removable storage device/s 144, such as a compact disk (CD), digital video disk (DVD), flash drive, or flash memory card. In one or more embodiments, device interface(s) 143 can further include general purpose I/O interfaces such as inter-integrated circuit ($I^2C$), system management bus (SMB), and peripheral component interconnect (PCI) buses.

In one or more embodiments, management system 146 controls infrastructure support to IHSs 120 in nMDC 100. Management controller 148 of management system 146 manages or controls environmental sub system 105, network sub system 150, security sub system 151, fire suppression subsystem 152, and power distribution subsystem 153. In one or more embodiments, management system 146 is part of IHS 120. One of the IHS(s) 120 may be programmed to perform the role of management controller 148. In one or more embodiments, management system 146 is part of environmental subsystem 105. In one or more embodiments, management system 146 is at least partially remotely located, such as management functions being performed by remote device system 124. In one or more embodiments, management controller 148 is a programmable logic controller (PLC) that is connected to the other subsystems via one or more interconnects and communication protocols. Management controller 148 interfaces with IHSs 120, and the infrastructure subsystems (105, 150, 151, 152, and 153) and communicates to a network operations center or building management system via network 123. Management controller 148 can include some or all of the components and functionality described above for IHSs 120. In one or more embodiments, management controller 148 acts as supervisory controller to control first and second AHU 106a-106b to provide the functionality described herein. First and second AHU 106a-106b provide pressurized supply air to cold aisle 154 and draw return air from hot aisle 155 within volumetric container 108.

AHUs 106a-106b include air mover(s) 156 to pressurize supply air that is delivered via supply air outlet(s) 157 to cold aisle 154. In one or more embodiments, return air is vented to the outside as a result of the pressurization of the supply air. In one or more embodiments, AHUs 106a-106b perform closed loop recirculation of a least a portion of the return air, drawing return air with a lower pressure than the supply air into return air inlet 158 of AHUs 106a-106b. In one or more embodiments, management controller 148 activates heater(s) 159 to warm or change the humidity of the supply air. In one or more embodiments, AHUs 106a-106b activate mechanical or evaporative cooling systems 160 to cool or change the humidity of the supply air. In one or more embodiments, AHU controller 162 of each AHUs 106a-106b adjusts mode actuator(s) 161 to adjust airflow through AHUs 106a-106b for the different modes of operation. In one or more embodiments, AHU controller 162 of each AHUs 106a-106b operates each AHUs 106a-106b autonomously. In one or more embodiments, IHSs 120 can communicate cooling requirements to management controller 148, via device interface 163. In one or more embodiments, management controller 148 can determine cooling requirements based in part on the received cooling requirements of IHSs 120 based on values provided by power consumption monitor 170, rack pressure sensor 171a, rack humidity sensor 172a, and rack temperature sensor 173a. For example, the cooling requirement can indicate a temperature set point and a current temperature of the supply air and a current temperature of the return air. As another example, the cooling requirement can indicate a current heat load being produced by IHSs 120. In one or more embodiments, management controller 148 can determine cooling requirements based in part on outside environmental sensors, depicted as outside pressure sensor 171b, outside temperature sensor 172b, and outside humidity sensor 173b. In one or more embodiments, management controller 148 can determine respective cooling requirements within volumetric container 108 based in part on cold aisle (CA) environmental sensors depicted as CA pressure sensor 171c, CA temperature sensor 172c, and CA humidity sensor 173c and/or based in part on hot aisle (HA) environmental sensors depicted as HA pressure sensor 171d, HA temperature sensor 172d, and HA humidity sensor 173d.

According to aspects of the present disclosure, as viewed, volumetric container 108 of nMDC 100 has first side 175a

(front and/or cold aisle side), second side 175b (rear and/or cold aisle side), left lateral side 175c, and right lateral side 175d. First side 175a is proximate to and encloses cold aisle 154 and includes first opening 176a that is covered by first panel 177a. Second side 175b is proximate to and encloses hot aisle 155. In one or more dual-AHU embodiments in which both a front and a rear AHU are provided to cool nMDC 100, second side 175b includes second opening 176b that is covered by second (rear) panel 177b. A portion of interior space 178 within volumetric container 108 extends between cold aisle 154 and hot aisle 155. Each panel 177a-177b includes at least one aperture (opening) 179 that connects supply air outlet 157 and return air inlet 158 of one or two AHUs 106a-106b to interior space 178 within volumetric container 108. When second AHU 106b is not installed, a panel without an aperture/opening can be substituted for second panel 177b or an aperture insert can be used to close and mechanically seal the opening. Return air duct 114 extends horizontally, presenting first outlet opening 183a to first side 175a of volumetric container 108 and presenting second outlet opening 183b to second side 175b of volumetric container 108. When an AHU is installed, such as AHU 106a, first outlet opening 183a aligns with and seals to return air inlet 148 of AHU 106a. When an AHU is not installed, such as AHU 106b, second outlet opening 183b is blocked by second panel 116b.

Heat-generating IT components 101 installed in the interior space of volumetric container 108 have first side 180a (front and or cold aisle side) and second side 180b (rear and/or hot aisle side), opposed to first side 180a, as well as left lateral side 180c and right lateral side 180d. First side is designed to face cold aisle 154 and second side 180b is designed to face hot aisle 155. Within interior space 178, supply air directing plenum 118 is defined between: (i) an interior surface of at least one of the first and second lateral sides 175c, 175d of volumetric container 108 and an adjacent lateral side 180c-180d of heat-generating IT component(s) 101; and (iii) chimney 112 of return air plenum 110 and second panel 177b. Second AHU 106b, proximate to hot aisle 155, has supply air outlet 157 coupled to air intake duct 181 of supply air directing plenum 118, and supply air from second AHU 160b is directed, via supply air directing plenum 118 to cold aisle 154 and into first side 180a of heat-generating IT component(s) 101. Volumetric container 108 is air tight. Mechanical seals 182a-182b extend around an exterior of respectively panels 177a-177b to mechanically seal panels 177a-177b to a receiving edge of corresponding opening 176a-176b. Access to IT components 101 is enabled via de-engaging at least one section of a selected panel 177a-177b from a receiving edge of corresponding opening 176a-176b and opening selected panel 177a-177b to reveal corresponding opening 176a-176b.

Figure 2:
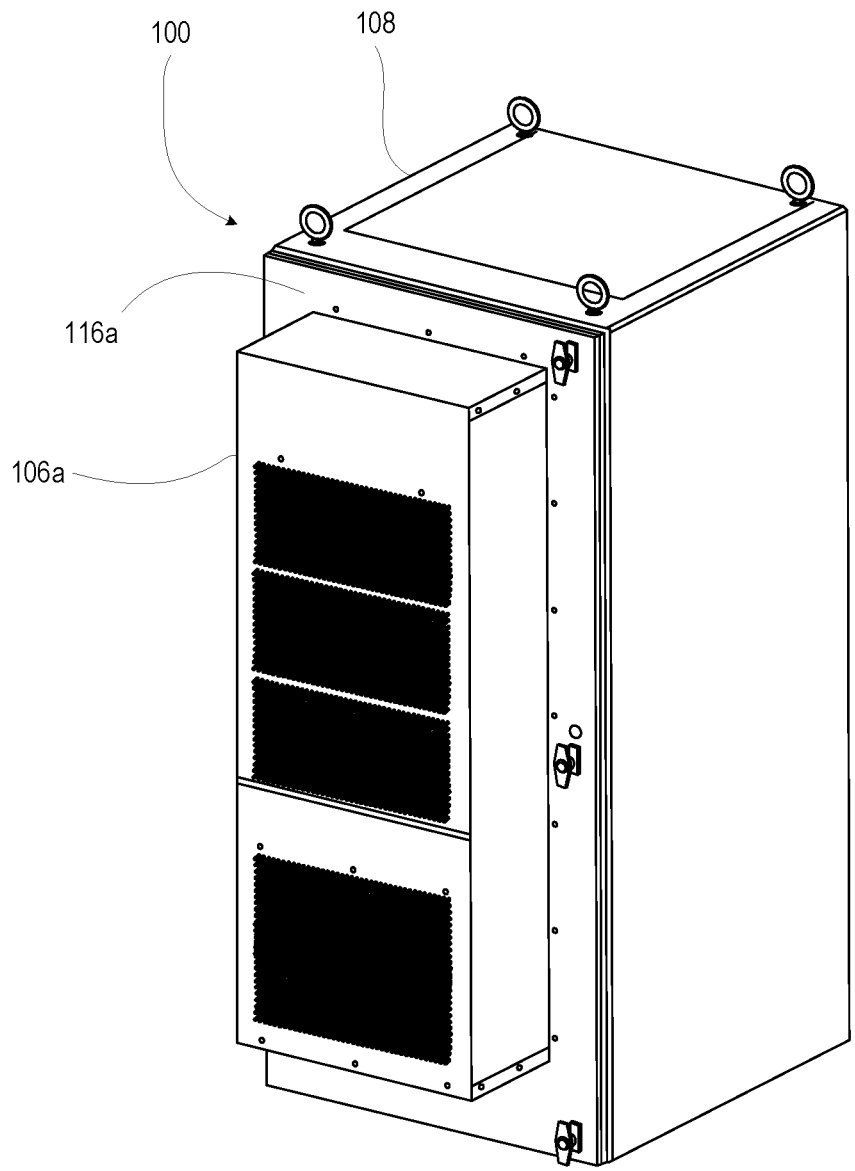
FIG. 2 depicts a three-dimensional front right view of an example nMDC that includes one air handling unit (AHU), according to one or more embodiments.

FIG. 2 depicts a three-dimensional view of example nMDC 100 that includes one AHU 106a mounted on first panel 116a, which can be removed without tools. Volumetric container 108 is sized as a "nano data center" for placement at an edge user. As used herein, "nano" refers to a data center that includes less than a full rack height of IT components 101 (FIG. 1). Nano is smaller than a "micro" data center that refers to an MDC that supports one or two full-height RIHSs. In one or more embodiments, one AHU 106a can be selected for use in locations having lower ambient temperatures and/or for use with IT equipment having low cooling requirements of nMDC 100. For example, cooling requirements of IT components 101 can be based on telecommunication (Telco) equipment that is capable of 8000 W of load. AHU 106a cools nMDC 100 with contained airflow that satisfies Network Equipment-Building System (NEBS) safety, spatial and environmental design guidelines applied to telecommunications equipment in the United States of America. nMDC 100 can also satisfy telco carrier efficiency requirements. In one or more embodiments, one AHU 106a can provide sufficient cooling performance and reliability margin for a particular application. In one or more embodiments, two AHUs 106a-106b are required to satisfy cooling performance and reliability requirements as discussed with regard to FIGS. 6-7.

Figure 3:
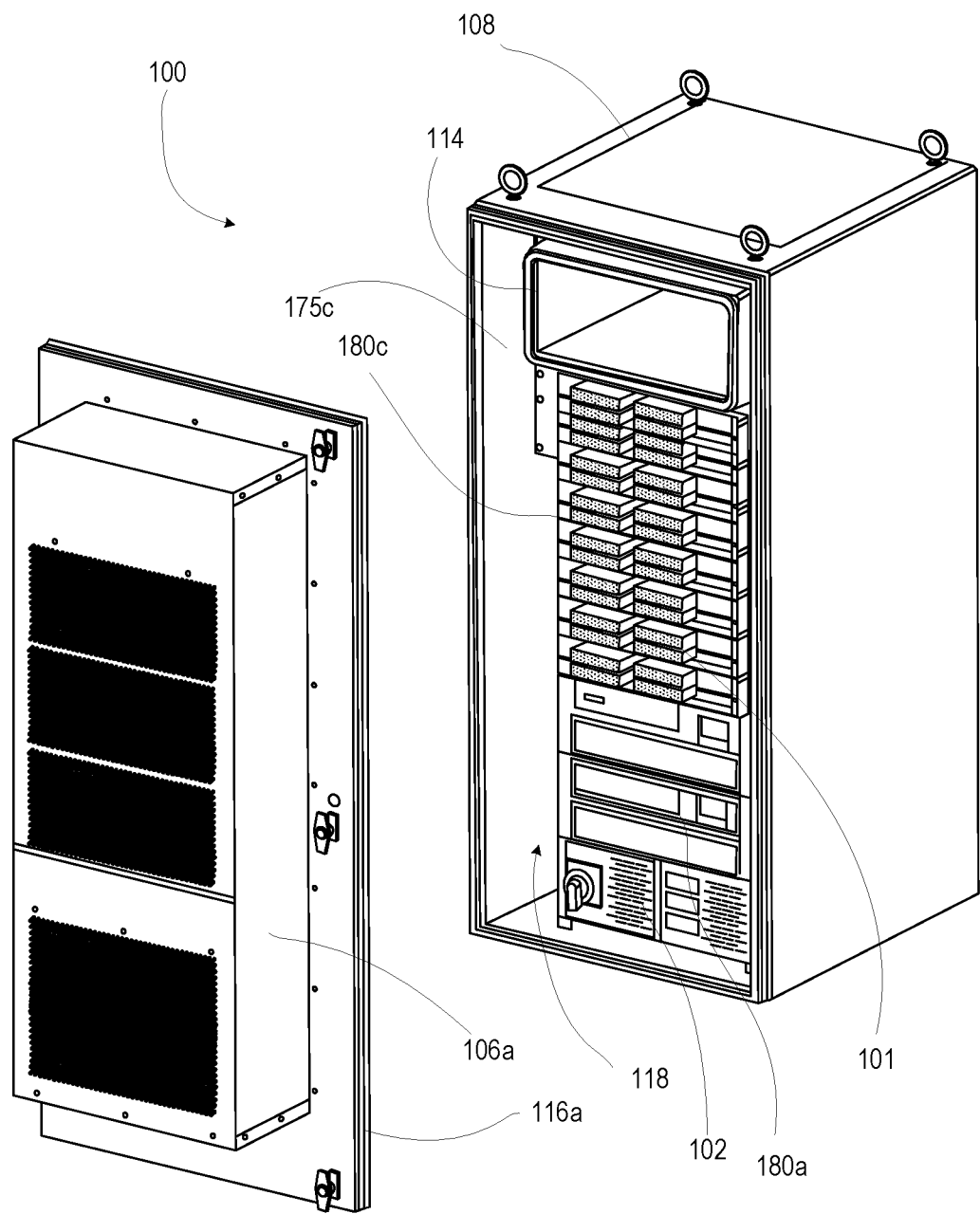
FIG. 3 depicts a three-dimensional front right view of the example nMDC of FIG. 2 that includes one AHU mounted to a first panel that is removed or opened to access a first side of IT components, according to one or more embodiments.

FIG. 3 depicts a three-dimensional front right view of the example nMDC 100 that includes one AHU 106a mounted to first panel 177a that is removed or opened to access first side 180a of IT components 101 within volumetric container. In one particular embodiment, nMDC 100 includes volumetric container 204 that is sized to receive fifteen (15) rack units (RUs) of IT components 101 (FIG. 1). Supply air directing plenum 118 is defined between lateral left side 175c of volumetric container 108 and left side 180c of IT components 101. Return air duct 114 is above IT components 101. OT components 102 in a 4RU flex bay are positioned below IT components 101, depicted as half width management module (PMM) and half width controls and monitoring module (CMM). In one or more embodiments, an nMDC can be configured to only accept one AHU 106a and omit supply air directing plenum 118 (not shown). In one or more embodiment, an nMDC 100 includes supply air directing plenum 118 without a second AHU 106b (FIG. 1), which enables having less inventory items to maintain and enables retrofitting with second AHU 106b (FIG. 1) when required.

Figure 4:
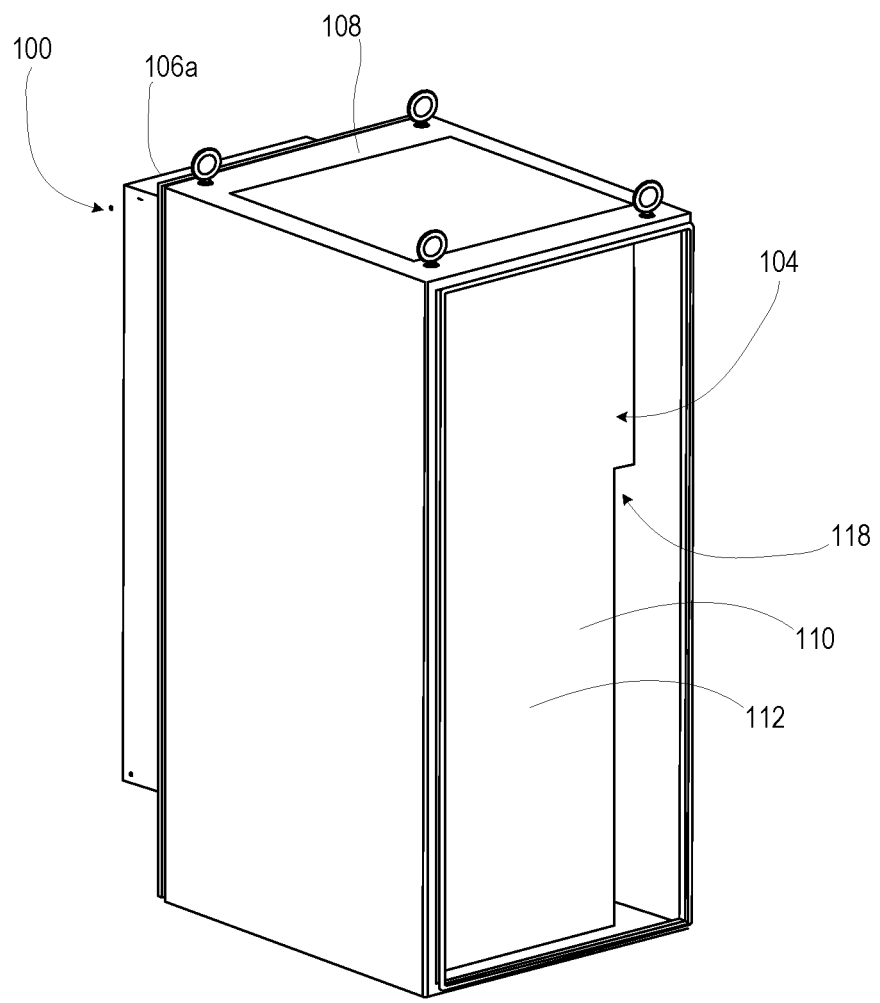
FIG. 4 depicts a three-dimensional right rear view of the example nMDC of FIG. 2 that includes chimney of rear area plenum and supply air directing plenum, according to one or more embodiments.

FIG. 4 depicts a three-dimensional right rear view of example nMDC 100 that includes chimney 112 of rear area plenum 110 and supply air directing plenum 118. Chimney 112 is sealed to interior surfaces of volumetric container 108 to enshroud second side 180b of IT components 101 (FIG. 1). Chimney 112 is also sealed to edges of second side 180b (FIG. 5) of IT components 101 (FIG. 1) around supply air directing plenum 118 as described below in FIG. 7.

Figure 5:
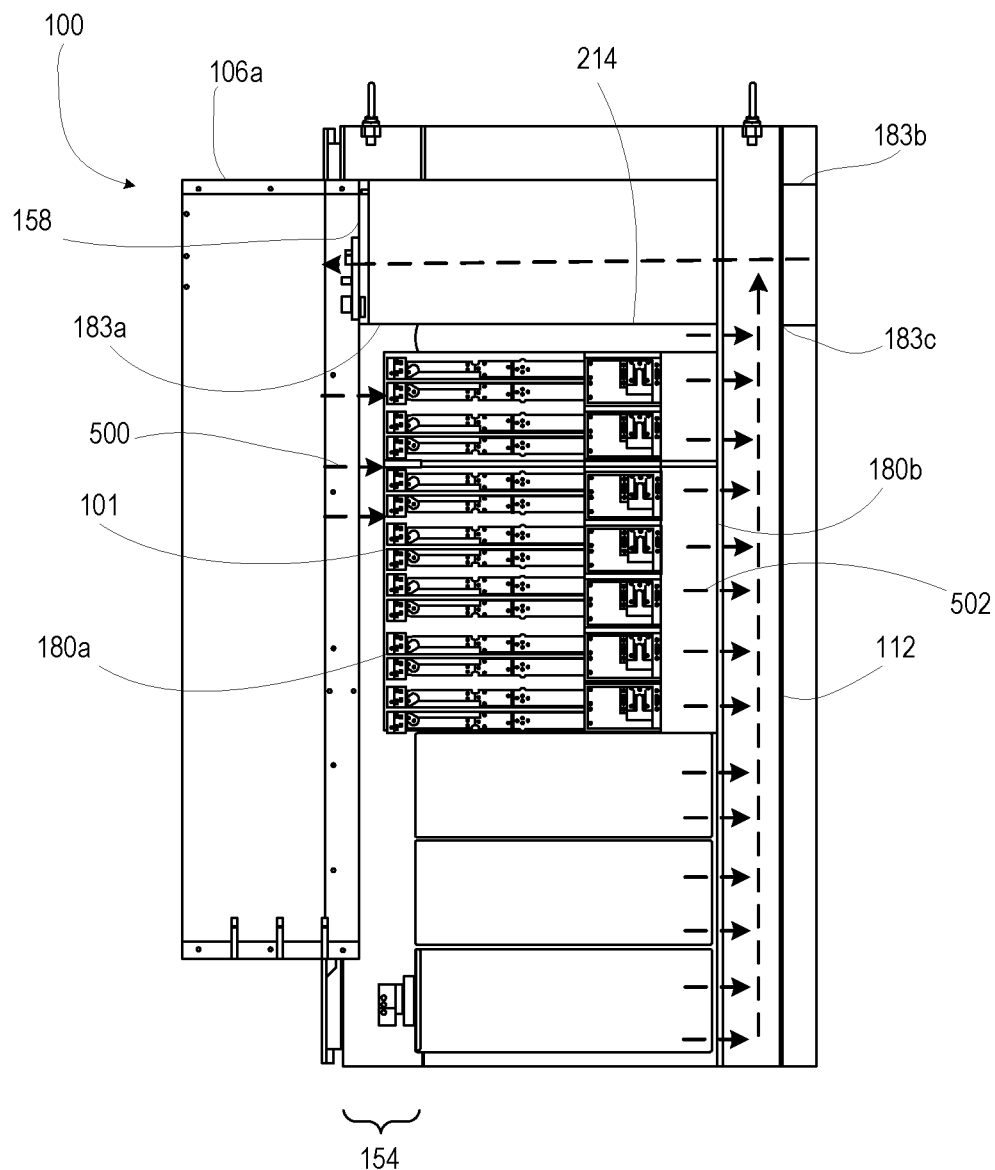
FIG. 5 depicts a three-dimensional right view of the example nMDC of FIG. 2 that is longitudinally cutaway and annotated with air flows, according to one or more embodiments.

FIG. 5 depicts a three-dimensional right view of example nMDC 100 that is longitudinally cutaway and annotated with air flows. Supply air 500 moves from AHU 106a, across cold aisle 154 into first side 180a of IT components 101 and then passes out of second side 180b of IT components 101 as return air. Chimney 112 captures return air and directs return air 502 to return air duct 114 to be directed back over cold aisle 154 to return air inlet 158 of AHU 106a. Return air duct 114 extends horizontally, presenting first outlet opening 183a to first side 175a of volumetric container 108 and presenting second outlet opening 183b to second side 175b of volumetric container 108. When an AHU is installed, such as AHU 106a, first outlet opening 183 aligns with and seals to return air inlet 148 of AHU 106a. When an AHU is not installed, such as AHU 106b, second outlet opening 183b is blocked by second panel 116b.

Figure 6:
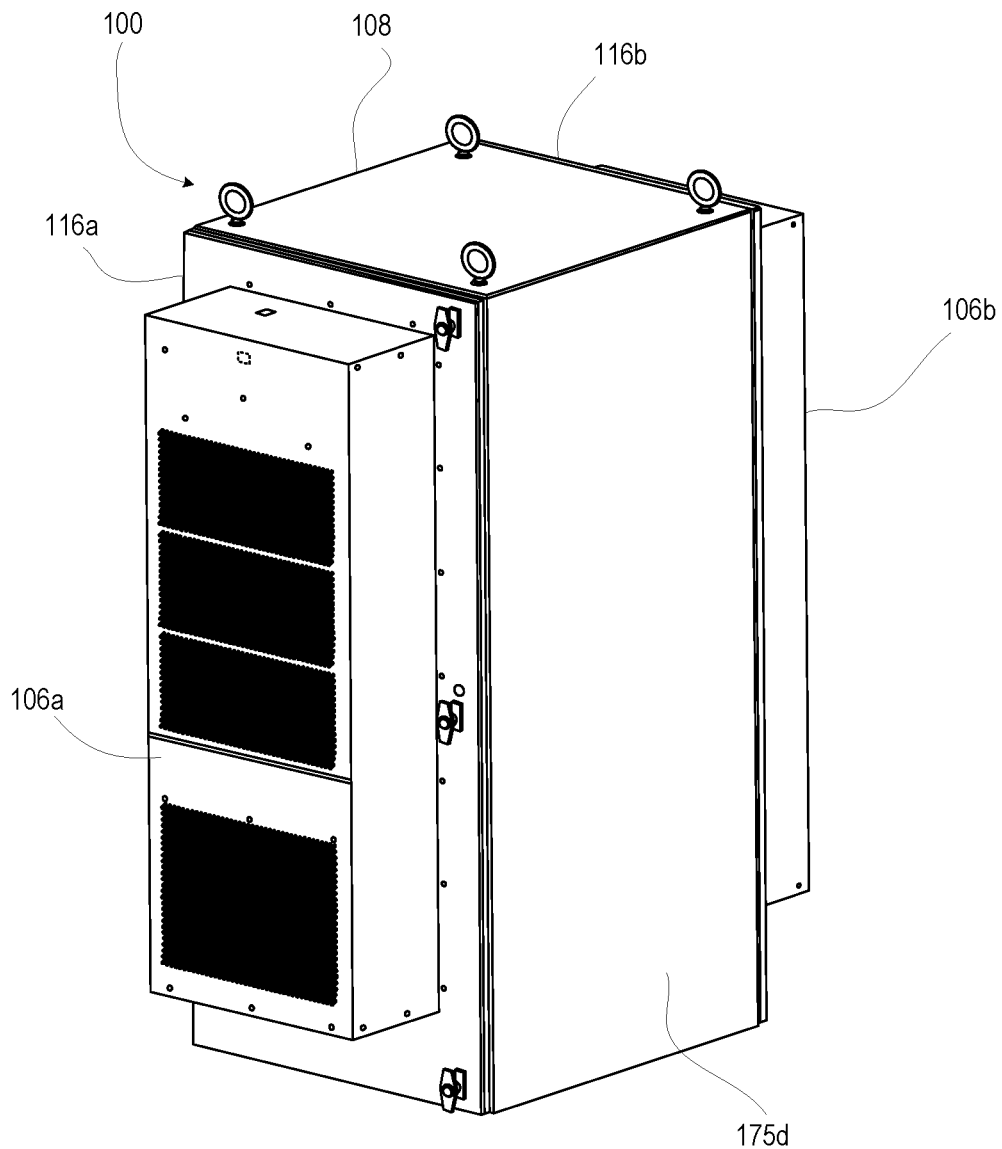
FIG. 6 depicts a three-dimensional front right view of an example nMDC that includes two AHUs, according to one or more embodiments.

FIG. 6 depicts a three-dimensional front right view of an example nMDC 100 that includes two AHUs 106a-106b. Two AHUs 106a-106b enhance resiliency and increase cooling capacity. Resiliency is the ability of a server, network, storage system, or an entire data center, to recover quickly and continue operating even when there has been an equipment failure, power outage or other disruption. In one or more embodiments, AHUs 106a-106b are identical. In one or more embodiments, AHUs 106a-106b can operate autonomously. In one or more embodiments, management controller 148 (FIG. 1) controls AHUs 106a-106b in tandem with coordinated changes in operating mode. In one or more embodiments, one of AHUs 106a-106b can operate, while the other one of AHUs 106a-106b remains inactive when not needed or when requiring servicing.

Figure 7:
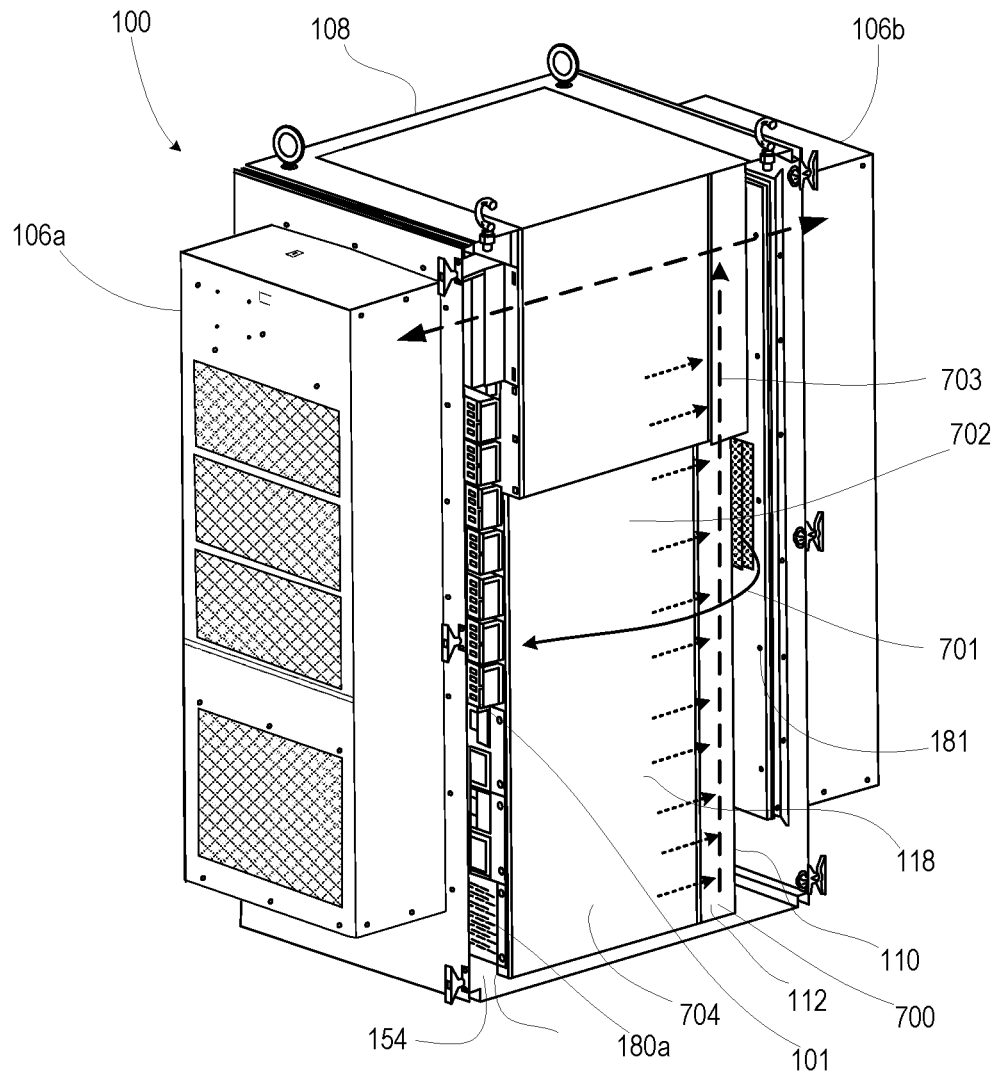
FIG. 7 depicts a three-dimensional right cutaway view of the example nMDC of FIG. 6 that includes two AHUs, according to one or more embodiments.

FIG. 7 depicts a three-dimensional right cutaway view of example MDC 100 that includes two AHUs 106a-106b. A portion of supply air 500 (FIG. 5) is provided from supply air outlet 158 (FIG. 1) of AHU 106a, across cold aisle 154 into first side 180a of IT components 101. Another portion of supply air 701 is provided from supply air outlet 157 (FIG. 5) of AHU 106b, through supply air duct 181 and supply air directing plenum 118 to cold aisle 154 and into first side 180a of IT components 101. The combined supply air from both AHUs 106a-106b then passes out of second side 180b of IT components 101 as return air 703. Chimney 112 captures return air and directs a portion of return air to return air duct 114 (FIG. 5) to be directed back over IT components 101 and cold aisle 154 to return air inlet 158 (FIG. 5) of AHU 106a via first outlet opening 183a (FIG. 5). The remaining portion of return air captured by chimney 112 is received by return air inlet 158 (FIG. 1) of AHU 106b via second outlet opening 183b (FIG. 5) of return air duct 114 (FIG. 5). Return air is contained within chimney 112 along an inner side of supply air directing plenum 118 by flange 700 of chimney 112 that is sealed to right panel 702 of IT rack 704 that supports IT components 101. Flange 700 and right panel 702 define an inner surface of supply air directing plenum 118. An outer surface of supply air directing plenum 118 is defined by right lateral wall 175d (FIG. 6) of volumetric container 108.

Figure 8A:
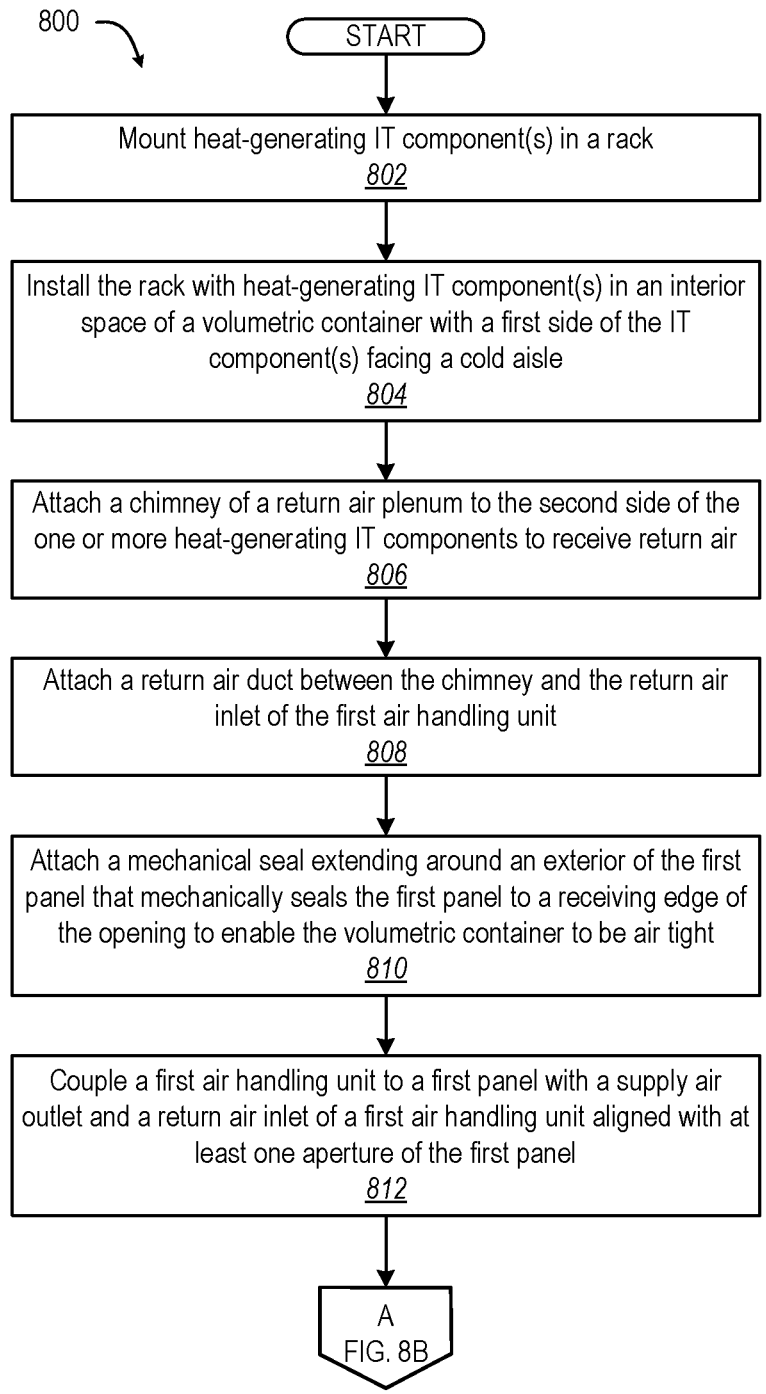
FIGS. 8A-8B present a flow diagram of a method for installing an air handling system that is intended to moderate or cool a temperature of an nMDC, according to one or more embodiments.
Figure 8B:
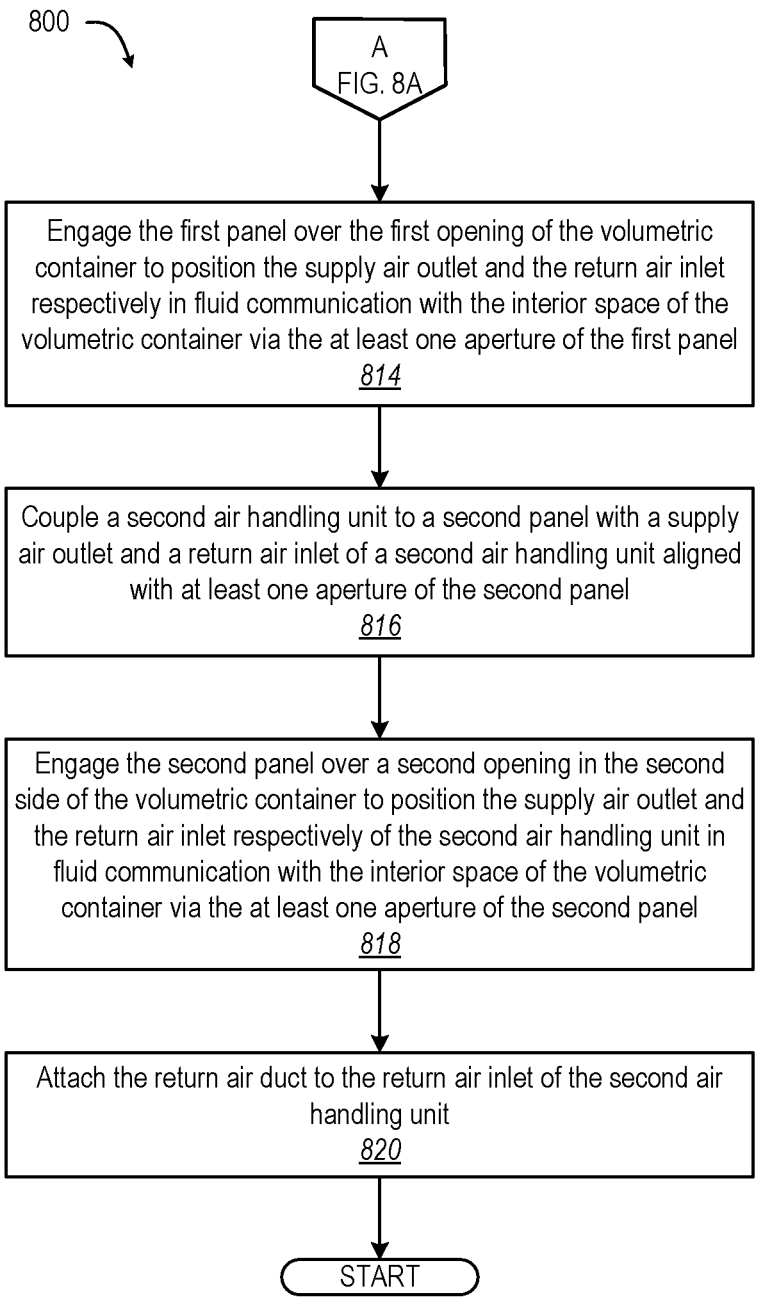

FIGS. 8A-8B (FIG. 8) present a flow diagram of a method for installing an air handling system that is intended to moderate or cool a temperature of an nMDC. The description of method 800 is provided with general reference to the specific components illustrated within the preceding FIGS. 1-7. In at least one embodiment, method 800 can be implemented using an automated assembly system under control of an IHS, such as IHS 120 (FIG. 1). With reference to FIG. 8A, method 800 includes mounting heat-generating IT component(s) in a rack (block 802). The IT components have a first side and a second side, opposed to the first side. The first side of each IT component is designed to face the cold aisle, and the second side of each IT component is designed to face the hot aisle. Method 800 includes installing the rack with heat-generating IT component(s) in an interior space of a volumetric container with a first side of the IT component(s) facing a cold aisle (block 804). Volumetric container has a first side with at least a first opening and is configured with (i) a cold aisle proximate to the first side, (ii) a hot aisle proximate to a second side, which is opposed to the first side and (iii) the interior space extending between the cold aisle and hot aisle. In one or more embodiments, an empty rack is first installed in the volumetric container. IT component(s) are then mounted in the rack. In one or more embodiments, installing the heat-generating IT component(s) in an interior space of a volumetric container defines a space for a supply air directing plenum between the lateral side of the volumetric container and the adjacent sides of the heat-generating IT component(s). For example, the size of volumetric container 108 (FIG. 1) can be selected to be laterally wider than required for a particular width of the IT components, creating the space when the IT components are installed. The volumetric container has opposed, first and second lateral side walls connected to and extending between the first side and the second side of the volumetric container. The supply air directing plenum is defined by: (i) an interior surface of at least one of the first and second lateral side walls of the volumetric container and a panel extending along an adjacent lateral side of the one or more heat-generating IT components; and (iii) the return air plenum and the second panel. In one or more embodiments, the IT components are installed in a rack. Either the IT components or the rack are enclosed on the lateral side, providing a panel for guiding the supply air around the IT components and rack.

Method 800 includes attaching a chimney of a return air plenum to the second side of the one or more heat-generating IT components to receive return air (block 806). Method 800 includes attaching a return air duct extending between the chimney and the return air inlet of the first air handling unit (block 808). The return air duct extends from the chimney at the hot aisle through the interior space of the volumetric container to the cold aisle and is connected to the return air inlet. The return air duct directs the return air from the chimney to the return air inlet of the first AHU. In one or more embodiments, method 800 includes attaching a mechanical seal extending around an exterior of the first panel that mechanically seals the first panel to a receiving edge of the opening in the first side of the container to enable the volumetric container to be air tight (block 810). IT component(s) can later be access via de-engaging at least one section of the first panel from a receiving edge of the first opening and opening the first panel to reveal the first opening.

Method 800 includes coupling a first air handling unit to a first panel with a supply air outlet and a return air inlet of the first AHU aligned with at least one corresponding aperture of the first panel (block 812). Method 800 includes engaging the first panel over the first opening of the volumetric container to position the supply air outlet and the return air inlet respectively in fluid communication with the cold aisle of the volumetric container and the return air duct via the at least one corresponding aperture of the first panel (block 814). The supply air outlet directs pressurized supply air into the cold aisle causing the supply air to pass through the first side of the one or more heat-generating IT components.

In one or more embodiments, method 800 includes coupling a second AHU to a second panel with a supply air outlet and a return air inlet of the second AHU aligned with at least one corresponding aperture of the second panel (block 816). Method 800 includes engaging the second panel over a second opening in the second side of the volumetric container to position the supply air outlet and the return air inlet respectively of the second air handling unit in fluid communication with the cold aisle of the volumetric container via a supply air duct and supply air directing plenum and with the return air chimney via the at least one corresponding aperture of the second panel (block 818). The supply air outlet of the second AHU directs pressurized supply air into the cold aisle via the supply air directing plenum causing the supply air to pass through the interior space into the cold aisle and into the first side of the one or more heat-generating IT components. The second air handling unit can provide cooling from the second side of the volumetric container, independent of the operation of the first AHU. In one embodiment, method 800 includes fluidly connecting the return air duct extending from the chimney to the return air inlet of the second AHU (block 820). Then method 800 ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular data center (MDC) comprising:
a volumetric container having a first side with a t least a first opening and configured with (i) a cold plenum proximate to the first side; (ii) a hot plenum proximate to a second side that is opposed to the first side; and (iii) interior space extending between the cold plenum and hot plenum, the volumetric container comprising a first panel engageable over the first opening and having at least one aperture; and
one or more heat-generating information technology (IT) components installed in the interior space of the volumetric container, each of the one or more IT components having a first side and a second side, opposed to the first side, the first side designed to face the cold plenum and the second side designed to face the hot plenum;

a first air handling unit that is physically mounted to the first panel such that the first air handling unit is removeable with the first panel, the first air handling unit being a physical component comprising air movers, heaters, mechanical/evaporative cooling devices, and an AHU controller, the first air handling unit having a supply air outlet and a return air inlet that are respectively in fluid communication with the interior space of the volumetric container via the at least one aperture of the first panel, the supply air outlet directing pressurized supply air into the cold plenum causing the supply air to pass through the first side of the one or more heat-generating IT components; and a return air plenum comprising:
    a chimney configure within the hot plenum and that receives return air from the second side of the one or more heat-generating IT components; and
    a return air duct extending from the chimney at the hot plenum through the interior space of the volumetric container to the cold plenum and connected to the return air inlet, the return air duct directing the return air from the chimney to the return air inlet of the first air handling unit.

2. The MDC of claim 1, wherein:
the chimney enshrouds the second side of the one or more heat-generating IT components to receive all of the return air and presents an upper opening; and
the return air duct extends over the one or more heat-generating IT components and comprises a bottom inlet opening connected to an upper opening of the chimney and comprises a first outlet opening coupled to the return air inlet of the first air handling unit.

3. The MDC of claim 1, wherein the volumetric container further comprises a second panel engageable over a second opening in the second side of the chassis.

4. The MDC of claim 3, wherein:
the volumetric container further comprises:
    opposed, first and second lateral side walls connected to and extending between the first side and the second side of the volumetric container;
    a supply air directing plenum defined between: (i) an interior surface of at least one of the first and second lateral side walls of the volumetric container and an adjacent lateral side of the one or more heat-generating IT components; and (iii) the return air plenum and the second panel;
the MDC further comprises a second air handling unit coupled to the second panel and having a supply air outlet and a return air inlet that are respectively in fluid communication with the interior space of the volumetric container via an aperture of the second panel, the supply air outlet of the second air handling unit in fluid communication with and directing pressurized supply air into the supply air directing plenum that passes around the return air plenum, around the lateral side of the one or more heat-generating IT components, to the first side of the one or more heat-generating IT components; and
a return air duct further connected to the return air inlet of the second air handling unit, the return air duct directing the return air from the chimney to the respective return air inlets of the first air handling unit and the second air handling units.

5. The MDC of claim 4, wherein:
the chimney is pneumatically sealed to the second side of the one or more heat-generating IT components to receive all of the return air and the chimney presents an upper opening; and
the return air duct extends over the one or more heat-generating IT components and comprises a bottom inlet opening connected to the upper opening of the chimney, and the return air duct comprises a first outlet opening coupled to the return air inlet of the first air handling unit, and further comprises a second outlet opening coupled to the return air inlet of the second air handling unit.

6. The MDC of claim 1, further comprising a rack positioned in the interior space and that receives the one or more heat-generating IT components.

7. The MDC of claim 1, wherein:
the first panel comprises a mechanical seal extending around an exterior of the first panel that mechanically seals the first panel to a receiving edge of the opening to enable the volumetric container to be air-tight; and
access to the one or more IT components is enabled via de-engaging at least one section of the first panel from a receiving edge of the first opening and opening the first panel to reveal the first opening.

8. An air handling system for a modular data center (MDC), the air handling system comprising:
a volumetric container having a first side with at least a first opening and configured with (i) a cold plenum proximate to the first side and (II) a hot plenum proximate to a second side that is opposed to the first side and (III) interior space extending between the cold plenum and hot plenum, the volumetric container comprising a first panel engageable over the first opening and having at least one aperture; and
a first air handling unit that is physically mounted to the first panel such that the first air handling units is removeable with the first panel, the first air handling unit being a physical component comprising air movers, heaters, mechanical/evaporative cooling devices, and an AHU controller, the first air handling unit having a supply air outlet and a return air inlet that are respectively in fluid communication with the interior space of the volumetric container via the at least one aperture of the first panel, the supply air outlet directing pressurized supply air into the cold plenum causing the supply air to pass through one or more heat-generating IT components that may be installed in the interior space of the volumetric container, each of the one or more IT components having a first side and a second side, opposed to the first side, the first side designed to face the cold plenum and the second side designed to face the hot plenum; and
a return air plenum comprising:
    a chimney configured within the hot plenum and that receives return air form the second side of the one or more heat-generating IT components; and
    a return air duct extending form the chimney at the hot plenum through the interior space of the volumetric container to the cold plenum and connected to the return air inlet, the return air duct directing the return air from the chimney to the return air inlet of the first air handling unit.

9. The air handling system of claim 8, wherein:
the chimney enshrouds the second side of the one or more heat-generating IT components to receive all of the return air and presents an upper opening; and the return air duct extends over the one or more heat-generating IT components and comprises a bottom inlet opening connected to the upper opening of the chimney and comprises a first outlet opening coupled to the return air inlet of the first air handling unit.

10. The air handling system of claim 8, wherein the volumetric container further comprises a second panel engageable over a second opening in the second side of the chassis.

11. The air handling system of claim 10, wherein:
the volumetric container further comprises:
opposed, first and second lateral side walls connected to and extending between the first side and the second side of the volumetric container;
a supply air directing plenum defined between: (i) an interior surface of at least one of the first and second lateral side walls of the volumetric container and an adjacent lateral side of the one or more heat-generating IT components; and (iii) the return air plenum and the second panel;
the MDC further comprises a second air handling unit coupled to the second panel and having a supply air outlet and a return air inlet that are respectively in fluid communication with the interior space of the volumetric container via an aperture of the second panel, the supply air outlet of the second air handling unit in fluid communication with and directing pressurized supply air into the supply air directing plenum that passes around the return air plenum, around the lateral side of the one or more heat-generating IT components, to the first side of the one or more heat-generating IT components; and
a return air duct further connected to the return air inlet of the second air handling unit, the return air duct directing the return air from the chimney to the respective return air inlets of the first air handling unit and the second air handling units.

12. The air handling system of claim 11, wherein:
the chimney is pneumatically sealed to the second side of the one or more heat-generating IT components to receive all of the return air and presents an upper opening; and
the return air duct extends over the one or more heat-generating IT components and comprises a bottom inlet opening connected to the upper opening of the chimney, and the return air duct comprises a first outlet opening coupled to the return air inlet of the first air handling unit, and further comprises a second outlet opening coupled to the return air inlet of the second air handling unit.

13. The air handling system of claim 8, further comprising a rack positioned in the interior space and that receives the one or more heat-generating IT components.

14. The air handling system of claim 8, wherein attaching the chimney to the second side of the one or more heat-generating IT components
the first panel comprises a mechanical seal extending around an exterior of the first panel that mechanically seals the first panel to a receiving edge of the opening to enable the volumetric container to be air-tight; and
access to the one or more IT components is enabled via de-engaging at least one section of the first panel from a receiving edge of the first opening and opening the first panel to reveal the first opening.

15. A method for installing an air handling system that is intended to moderate or cool a temperature of a modular data center (MDC), the method comprising:
installing one or more heat-generating information technology (IT) components in an interior space of a volumetric container, the volumetric container having a first side with at least a first opening and configure with (i) a cold plenum proximate to the first side, and (II) a hot plenum proximate to a second side that is opposed to the first side and (III) the interior space extending between the cold plenum and hot plenum, each of the one or more IT components having a first side and a second side, opposed to the first side, the first side designed to face the cold plenum and the second side designed to face the hot plenum;
attaching a chimney configured within the hot plenum to the second side of the one or more heat-generating IT components to receive return air as a part of a return air plenum;
mounting a first air handling unit to an outside of a first panel with a supply air outlet and a return air inlet of the first air handling unit aligned with at least one aperture of the first panel such that the first air handling unit is removeable with the first panel, the first air handling unit being a physical component comprising air movers, heaters, mechanical/evaporative cooling devices, and an AHU controller;
attaching a return air duct between the chimney and the return air inlet of the first air handling unit, the return air duct extending from the chimney at the hot plenum through the interior space of the volumetric container to the cold plenum and connected to the return air inlet, the return air duct directing the return air from the chimney to the return air inlet of the first air handling unit; and
engaging the first panel over the first opening of the volumetric container to position the supply air outlet and the return air inlet respectively in fluid communication with the interior space of the volumetric container via the at least one aperture of the first panel, the supply air outlet directing pressurized supply air into the cold plenum causing the supply air to pass through the first side of the one or more heat-generating IT components, the first air handling unit being physically located outside of the interior space of the volumetric container.

16. The method of claim 15, wherein installing the one or more heat-generating IT components in an interior space of a volumetric container comprises defining a supply air directing plenum between the volumetric container and the one or more heat-generating IT components, the volumetric container further comprising opposed, first and second lateral side walls connected to and extending between the first side and the second side of the volumetric container, the supply air directing plenum defined by: (i) an interior surface of at least one of the first and second lateral side walls of the volumetric container and an adjacent lateral side of the one or more heat-generating IT components; and (iii) the return air plenum and the second panel.

17. The method of claim 16, further comprising:
coupling a second air handling unit to a second panel with a supply air outlet and a return air inlet of a second air handling unit aligned with at least one aperture of the second panel;
engaging the second panel over a second opening in the second side of the volumetric container to position the supply air outlet and the return air inlet respectively of the second air handling unit in fluid communication with the interior space of the volumetric container via the at least one aperture of the second panel, the supply air outlet directing pressurized supply air into the cold plenum via the supply air directing plenum causing the supply air to pass through the first side of the one or more heat-generating IT components; and attaching the return air duct to the return air inlet of the second air handling unit.

18. The method of claim 15, wherein installing the one or more heat-generating IT components in the interior space of the volumetric container comprises:

mounting the one or more heat-generating IT components in a rack; and installing the rack with the one or more heat-generating IT components in the interior space of the volumetric container.

19. The method of claim 15, wherein installing the one or more heat-generating IT components in the interior space of the volumetric container comprises:

installing a rack in the interior space of the volumetric container; and mounting the one or more heat-generating IT components in the rack.

20. The method of claim 15, further comprising:

attaching a mechanical seal extending around an exterior of the first panel that mechanically seals the first panel to a receiving edge of the opening to enable the volumetric container to be air-tight; and accessing to the one or more IT components via de-engaging at least one section of the first panel from a receiving edge of the first opening and opening the first panel to reveal the first opening.

* * * * *